(12) United States Patent
Brandyberry et al.

(10) Patent No.: US 8,812,762 B2
(45) Date of Patent: *Aug. 19, 2014

(54) PRESENCE DETECTABLE BAFFLE FOR ELECTRICAL COMPONENTS IN A COMPUTING SYSTEM

(75) Inventors: Mark A. Brandyberry, Austin, TX (US); Todd W. Justus, Chapel Hill, NC (US); Paul D. Kangas, Raleigh, NC (US); Brent W. Yardley, Hillsboro, OR (US); Ivan R. Zapata, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 43 days.

This patent is subject to a terminal disclaimer.

(21) Appl. No.: 13/534,255

(22) Filed: Jun. 27, 2012

(65) Prior Publication Data

US 2013/0058037 A1 Mar. 7, 2013

Related U.S. Application Data

(63) Continuation of application No. 13/226,035, filed on Sep. 6, 2011.

(51) Int. Cl.
*G06F 13/00* (2006.01)
*H05K 7/20* (2006.01)

(52) U.S. Cl.
USPC ............... 710/301; 361/679.49; 361/679.51

(58) Field of Classification Search
USPC ........ 710/104, 301, 302; 361/679.01, 679.02, 361/679.31, 679.46–679.49, 679.51, 690, 361/694, 728, 730, 731
See application file for complete search history.

(56) References Cited

U.S. PATENT DOCUMENTS

| | | | |
|---|---|---|---|
| 3,967,874 A | 7/1976 | Calabro | |
| 4,894,749 A | 1/1990 | Elko et al. | |
| 5,568,610 A | 10/1996 | Brown | |
| 5,612,634 A | 3/1997 | MacKenna | |
| 5,636,347 A | 6/1997 | Muchnick et al. | |
| 5,914,858 A | 6/1999 | McKeen et al. | |
| 5,991,158 A | 11/1999 | Chan et al. | |
| 6,105,090 A | 8/2000 | Fosmo | |
| 6,425,028 B1 | 7/2002 | Fosmo | |
| 6,744,632 B2 | 6/2004 | Wilson et al. | |
| 7,403,383 B2 | 7/2008 | McGuff et al. | |
| 7,403,387 B2 | 7/2008 | Pav et al. | |
| 7,474,528 B1 | 1/2009 | Olesiewicz et al. | |
| 7,495,906 B2 | 2/2009 | Fujie et al. | |
| 7,788,421 B1 * | 8/2010 | Heath et al. ................... | 710/15 |
| 8,495,269 B2 * | 7/2013 | Brandyberry et al. ........ | 710/301 |
| 8,521,936 B2 * | 8/2013 | Brandyberry et al. ........ | 710/301 |
| 2009/0021906 A1 | 1/2009 | Tsai | |

OTHER PUBLICATIONS

IBM, "System Identifiable Memory DIMM Filler", IP.com Prior Art Database, Jan. 8, 2010, pp. 1-4, USA.

* cited by examiner

*Primary Examiner* — Glenn A Auve
(74) *Attorney, Agent, or Firm* — Edward J. Lenart; Katherine S. Brown; Biggers Kennedy Lenart Spraggins LLP

(57) ABSTRACT

A presence detectable baffle for electrical components in a computing system, including: a passive chassis having a form factor is consistent with an electrical component of the computing system; and a presence detectable pin set connected to the passive chassis, the pin set consistent with the electrical component.

6 Claims, 6 Drawing Sheets

PRESENCE DETECTABLE BAFFLE FOR ELECTRICAL COMPONENTS IN A COMPUTING SYSTEM

CROSS-REFERENCE TO RELATED APPLICATION

This application is a continuation application of and claims priority from U.S. patent application Ser. No. 13/226,035, filed on Sep. 6, 2011.

BACKGROUND OF THE INVENTION

1. Field of the Invention

The field of the invention is data processing, or, more specifically, methods, apparatus, and products for presence detectable baffle for electrical components in a computing system.

2. Description of Related Art

Modern computing systems are physically configurable as such computing systems include pluggable components that may be added to a computing system to expand the capabilities of the computing system. Modern computing systems also include computing components that generate heat. As such, cooling mechanisms such as fans and vents are included in a computing system to cool the computing system. As pluggable devices are added and removed from the computing system, however, the flow of air from the cooling mechanisms is altered and may not be carried out as originally designed.

SUMMARY OF THE INVENTION

A presence detectable baffle for electrical components in a computing system, including: a passive chassis having a form factor is consistent with an electrical component of the computing system; and a presence detectable pin set connected to the passive chassis, the pin set consistent with the electrical component.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
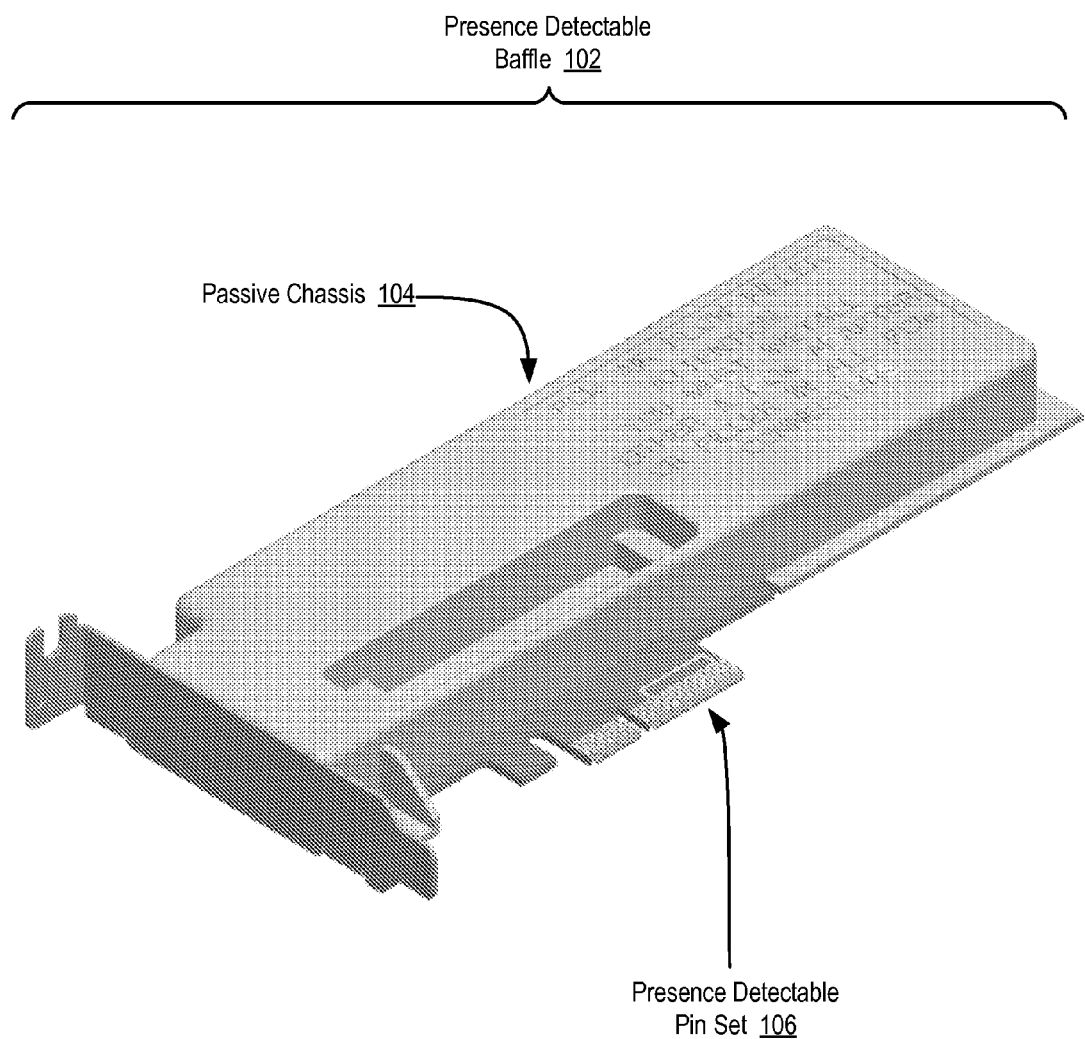
FIG. 1 sets forth a diagram of a presence detectable baffle for electrical components in a computing system according to embodiments of the present invention.

FIG. 1 sets forth a diagram of a presence detectable baffle (102) for electrical components in a computing system according to embodiments of the present invention. In the example of FIG. 1, the presence detectable baffle (102) is a physical structure that may be utilized to direct air flow within the computing system. Modern computing systems can include fans, vents, and other components of a cooling system designed to direct the flow of air in predetermined directions to distribute thermal loads created by components within the computing system. When removable electrical components such as, for example, a peripheral component interconnect ('PCI') expansion card, a dual in-line memory module ('DIMM'), a PCI Express ('PCIe') expansion card, and the like are removed from the computing system, the flow of air within the computing system may be altered. For example, a cooling system in a computing system may be designed to generate a particular pattern of air flow when all PCIe slots within the computing system are occupied by PCIe expansion cards. Removing a PCIe expansion card can cause the pattern of air flow to change as the PCIe expansion card is no longer in place to impact the flow of air within the computing system.

In the example of FIG. 1, the presence detectable baffle (102) can be utilized to direct air flow within the computing system in the sense that the presence detectable baffle (102) provides a physical structure that is similar in form to a computing component that is absent from the computing system. For example, if a PCIe expansion card is removed from the computing system, a presence detectable baffle (102) that is similar in physical form to a PCIe expansion card may be inserted into the PCIe slot from which the PCIe card was removed. Inserting the presence detectable baffle (102) therefore restores a computing system to approximately the same physical shape that was taken into account when designing a cooling system to move air in a particular pattern.

The presence detectable baffle (102) of FIG. 1 includes a passive chassis (104) having a form factor that is consistent with an electrical component of the computing system. A presence detectable baffle (102) that is designed to replicate the presence of a PCIe expansion card, for example, may include a passive chassis (104) having a form factor that is consistent with a PCIe expansion card. The passive chassis (104) of such an example presence detectable baffle (102) is similar in volume and shape to that of an actual PCIe expansion card. A passive chassis (104) of a presence detectable baffle (102) may be implemented with a variety of materials including, as one example, molded plastic.

In the example of FIG. 1, the electrical component of the computing system that the presence detectable baffle (102) is designed to mimic in form may be an expansion card. In the example of FIG. 1, an expansion card is a printed circuit board that can be inserted into an expansion slot of a computer motherboard to add functionality to a computing system. Such expansion cards may adhere to many different standards such as, for example, PCIe, PCI, Accelerated Graphics Port ('AGP'), Industry Standard Architecture ('ISA'), and so on.

In the example of FIG. 1, the electrical component of the computing system that the presence detectable baffle (102) is designed to mimic in form may be a memory module. In the example of FIG. 1, a memory module is computer memory that can be inserted into a memory slot of a computer motherboard to add memory to a computing system. Examples of memory modules include a DIMM, a Rambus in-line memory module ('RIMM'), a single in-line memory module ('SIMM'), and so on.

The presence detectable baffle (102) of FIG. 1 includes a presence detectable pin set (106) connected to the passive chassis (104). In the example of FIG. 1, the presence detectable pin set (106) is consistent with the electrical component that the presence detectable baffle (102) is designed to mimic in shape. The presence detectable pin set (106) is consistent with the electrical component in the sense that the presence detectable pin set (106) may have the same physical form as the pin set of the electrical component. In this way, the presence detectable baffle (102) can be inserted into a slot configured to receive the electrical component that the presence detectable baffle (102) is designed to mimic in shape and the pin set of the baffle (102) may physically connect to a pin receptacle of the slot in the same manner that a pin set of the electrical component connects to the pin receptacle of the slot. Consider an example in which the presence detectable baffle (102) is designed to mimic the form of a PCIe expansion card. In such an example, the presence detectable pin set (106) of the presence detectable baffle (102) is similar enough in physical form to the pin set of a PCIe expansion card so that the presence detectable baffle's (102) pin set (106) may be inserted into a pin set receptacle of a PCIe expansion slot—the same pin set receptacle that receives typical PCIe expansion cards.

In the example of FIG. 1, the presence detectable pin set (106) is configured to indicate that the presence detectable baffle (102) is installed and that the presence detectable baffle (102) is passive. The presence detectable pin set (106) may be configured to indicate that the presence detectable baffle (102) is installed and that the presence detectable baffle (102) is passive, for example, by including pins wired in such a way so as to present a unique presence detection signal when the detectable baffle (102) is inserted into a slot.

In embodiments in which the presence detectable baffle (102) of FIG. 1 includes a passive chassis (104) having a form factor that is consistent with a PCIe expansion card, the baffle's (102) presence detectable pin set (106) may also be compatible with the PCIe specification to indicate the presence of the baffle (102) in the PCIe slot. The PCIe specification defines the physical form factor of a PCIe expansion slot, the physical form factor of a PCIe expansion card, and utilization and functionality of each pin of a PCIe expansion card. According to the PCIe specification, interconnects between a PCIe expansion card and a PCIe expansion slot are composed of lanes. Each lane is composed of a transmit pair and receive pair of differential lines. Physical PCIe expansion slots may contain anywhere from one to thirty-two lanes, with lane counts written with an "x" prefix (e.g., x4 represents a four-lane expansion card or expansion slot).

The PCIe standard specifies a presence detect means to identify an installed adapter card for hot plug purposes. The PCIe standard includes a PRSNT1# signal line that is present on all PCIe bus width adapters. The pin in a PCIe expansion slot that represents the PRSNT1# signal line is connected to ground on a system board that the PCIe slot is mounted on. The PCIe standard also includes PRSNT2# signal pins. There are multiple PRSNT2# pins defined, corresponding to the bus width of the adapter. A PRSNT2# pin exists at the end of the connector for each of the x1, x4, x8, and x16 widths. Adapter cards that have a bus width greater than x1 include all of the intermediate PRSNT2# pins on their connector (e.g. a x16 adapter has four PRSNT2# pins: x1, x4, x8, x16). The PCIe standard requires that adapters connect the farthest PRSNT2# on their connector to the adapter's PRSNT1# pin. The PCIe standard states that all pins in a PCIe expansion slot that represent the PRSNT2# signal line are connected together to a single pull up resistor on the system board, such that the PRSNT2# signal line is pulled high when no PCIe expansion card is mounted within the PCIe expansion slot.

When a PCIe expansion card is inserted into the PCIe expansion slot, however, the PRSNT2# signal line is pulled low thereby indicating that a PCIe expansion card has been inserted into the PCIe expansion slot. The PRSNT2# signal line is pulled low because the pins of the PCIe expansion card that represent the PRSNT1# signal line and the farthest PRSNT2# signal line are connected. Because the pins of the PCIe expansion card that represent the PRSNT1# signal line and the farthest PRSNT2# signal line are connected, the pin in the PCIe expansion slot that represents the PRSNT2# signal line is now connected to ground on the system board, via the path between the PRSNT1# signal line and the farthest PRSNT2# signal line on the PCIe expansion card. In embodiments of the present invention, the pin set (106) of the presence detectable baffle (102) and the PRSNT2# signals on the system board (108) may be wired in such a way so as to present a unique presence detection signal when the presence detectable baffle (102) is inserted into a PCIe expansion slot, as explained in greater detail with reference to FIG. 2.

Figure 2:
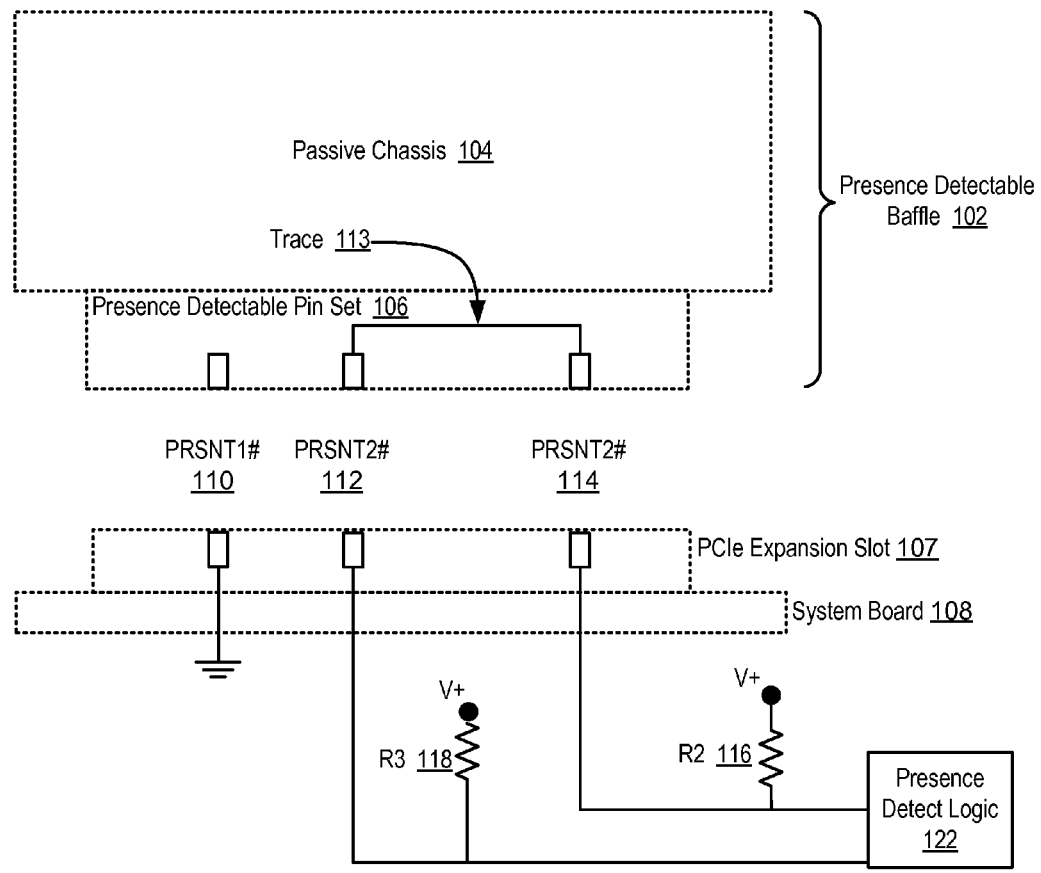
FIG. 2 sets forth a block diagram of a presence detectable baffle for electrical components in a computing system according to embodiments of the present invention.

For further explanation, FIG. 2 sets forth a block diagram of a presence detectable baffle (102) for electrical components in a computing system according to embodiments of the present invention. In embodiments of the present invention, the pin set (106) of the presence detectable baffle (102) and a system board (108) upon which a PCIe expansion slot (107) is mounted may be wired in such a way so as to present a unique presence detection signal when the presence detectable baffle (102) is inserted into a PCIe expansion slot (107). The term 'unique' is used here to describe the present detection signal presented by the presence detectable baffle (102) upon insertion into a PCIe expansion slot. For example, the pin set (106) of the presence detectable baffle (102) may be wired such that first PRSNT2# (112) pin, corresponding to a x1 width, and the second PRSNT2# (114) pin, corresponding to a x4 width, on the presence detectable pin set (106) are shorted together, for example, via a trace (113) running between the first PRSNT2# (112) pin and the second PRSNT2# (114) pin on the presence detectable pin set (106). Also, for example, the system board (108) may be wired such that the PRSNT2# signals from the PCIe expansion slot (107) are individually connected to pull up resistors (116, 118) and the presence detect logic (122). Additional PRSNT2# signals from the PCIe expansion slot (107) for wider widths (i.e. x8 or x16) may be combined and connected to the second PRSNT2# signal (114) and pull up resistor (116).

In the example of FIG. 2, the presence detect logic (122) will differentiate between when the PCIe expansion slot (107) is empty, when a presence detectable baffle (102) is inserted in the PCIe expansion slot (107), and when a standard PCIe expansion card is inserted in the PCIe expansion slot (107). Further, due to the unique individual wiring of the PRSNT2# signals on the system board (108), the presence detect logic (122) must differentiate between a x1 width PCIe expansion card and a wider PCIe expansion card (e.g. x4, x8, or x16) inserted in the PCIe expansion slot (107). The presence detect logic (122) may make this differentiation by momentarily placing a low signal level on the second PRSNT2# signal (114) and detecting the signal level on the first PRSNT2# signal (112).

When nothing is inserted into the PCIe expansion slot (107), pull-up resistors (116, 118) pull the voltage high so that the presence detect logic (122) reads a high voltage for both PRSNT2# (112, 114) signals. When the presence detect logic (122) places a momentary low voltage level on the second PRSNT2# signal (114), the first PRSNT2# signal (112)

remains at a high voltage level since there is no connection path between the two signals. Since the presence detect logic (122) reads a high voltage level on both PRSNT2# signals (112, 114) both at steady state and while momentarily placing a low voltage level on the second PRSNT2# signal (114), it determines that the PCIe expansion slot (107) is empty.

When a standard x1 width PCIe expansion card is inserted into the PCIe expansion slot (107), a connection is made between the PRSNT1# signal (110) and the first PRSNT2# signal (112). This is because the first PRSNT2# signal (112) is the farthest PRSNT2# pin on the x1 width PCIe expansion card. Since the PRSNT1# signal is connected to ground on the system board (108), the first PRSNT2# signal (112) goes to a low voltage level, and the presence detect logic (122) reads it as such. Since there is no connection on a x1 width PCIe expansion card to the second PRSNT2# signal (114), the second PRSNT2# signal (114) remains at a high voltage level due to the pull up resistor (116). When the presence detect logic (122) places a momentary low voltage level on the second PRSNT2# signal (114), the first PRSNT2# signal (112) remains at a low voltage level due to the connection to ground through PRSNT1# (110) described earlier. Since the presence detect logic (122) reads a low voltage level on the first PRSNT2# signal (112) and a high voltage level on the second PRSNT2# signal (114) both at steady state and while momentarily placing a low voltage level on the second PRSNT2# signal (114), it determines that there is a standard PCIe expansion card inserted in the PCIe expansion slot (107).

When a wider (i.e. x4, x8, or x16) standard PCIe expansion card is inserted into the PCIe expansion slot (107), a connection is made between the PRSNT1# signal (110) and the second PRSNT2# signal (114). This is because the second PRSNT2# signal (114) is the farthest (or may be combined with the farthest) PRSNT2# pin on the PCIe expansion card. Since the PRSNT1# signal is connected to ground on the system board (108), the second PRSNT2# signal (114) goes to a low voltage level, and the presence detect logic (122) reads it as such. Since there is no connection on a wider width PCIe expansion card to the first PRSNT2# signal (112), the first PRSNT2# signal (112) remains at a high voltage level due to the pull up resistor (118). When the presence detect logic (122) places a momentary low voltage level on the second PRSNT2# signal (114), the first PRSNT2# signal (112) remains at a high voltage level due to the lack of connection on a wider width PCIe expansion card described earlier. Since the presence detect logic (122) reads a high voltage level on the first PRSNT2# signal (112) and a low voltage level on the second PRSNT2# signal (114) both at steady state and while momentarily placing a low voltage level on the second PRSNT2# signal (114), it determines that there is a standard PCIe expansion card inserted in the PCIe expansion slot (107).

When a presence detectable baffle (102) is inserted into the PCIe expansion slot (107), a connection is made between the first PRSNT2# signal (112) and the second PRSNT2# signal (114) due to the unique wiring on the presence detectable pin set (106). The first PRSNT2# signal (112) and the second PRSNT2# signal (114) remain at a high voltage level due to the pull up resistors (116,118) on the system board (108), and the presence detect logic (122) reads them as such. When the presence detect logic (122) places a momentary low voltage level on the second PRSNT2# signal (114), the first PRSNT2# signal (112) transitions to a low voltage level due to the connection between them in the presence detectable pin set (106). Since the presence detect logic (122) reads a high voltage level on the first PRSNT2# signal (112) and the second PRSNT2# signal (114) at steady state, but instead reads a low voltage level on the first PRSNT2# signal (112) while momentarily placing a low voltage level on the second PRSNT2# signal (114), it determines that there is a presence detectable baffle (102) inserted in the PCIe expansion slot (107).

Figure 3:
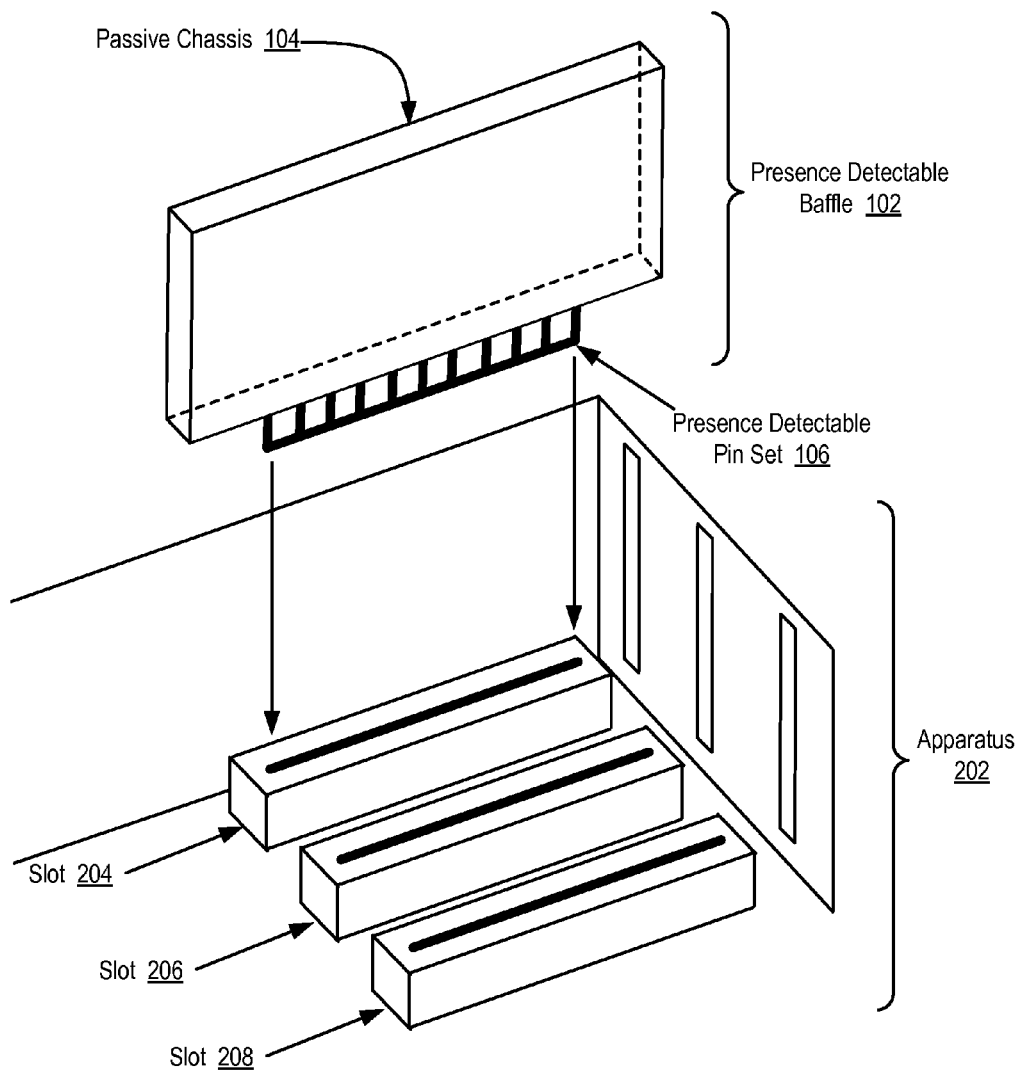
FIG. 3 sets forth a block diagram of apparatus for receiving a presence detectable baffle for electrical components according to embodiments of the present invention.

For further explanation, FIG. 3 sets forth a block diagram of apparatus (202) for receiving a presence detectable baffle (102) for electrical components according to embodiments of the present invention. The apparatus (202) of FIG. 3 includes one or more slots (204, 206, 208) for receiving an electrical component having a set of pins. In the example of FIG. 3, each slot (204, 206, 208) is configured to couple pins of the electrical component to the apparatus (202). Each slot (204, 206, 208) of FIG. 1 includes a plurality of pins that may be wired into a circuit board that the slot (204, 206, 208) is mounted on. Each slot (204, 206, 208) is capable of receiving an electrical component such as, for example, an expansion card. Each slot (204, 206, 208) is physically configured such that once an electrical component is inserted into the slot (204, 206, 208), an electrical connection is established between the electrical component and circuit board that the slot (204, 206, 208) is mounted on via the pins in the slot (204, 206, 208). Each slot (204, 206, 208) can adhere to a defined standard such as, for example, PCIe, PCI, and so on.

The apparatus (202) of FIG. 3 also includes a presence detectable baffle (102) installed in one of the slots (204, 206, 208). In the example of FIG. 3, the presence detectable baffle (102) includes a passive chassis (104) having a form factor consistent with the electrical component. A presence detectable baffle (102) that is designed to replicate the presence of a PCIe expansion card, for example, may include a passive chassis (104) having a form factor that is consistent with a PCIe expansion card. The passive chassis (104) of such an example presence detectable baffle (102) is similar in volume and shape to that of an actual PCIe expansion card. A passive chassis (104) of a presence detectable baffle (102) may be implemented with a variety of materials including, as one example, molded plastic.

The presence detectable baffle (102) of FIG. 3 also includes a presence detectable pin set (106) connected to the passive chassis (104). In the example of FIG. 3, the presence detectable pin set (106) is consistent with the electrical component that the presence detectable baffle (102) is designed to mimic in shape. The presence detectable pin set (106) is consistent with the electrical component in the sense that the presence detectable pin set (106) may have the same physical form as the pin set of the electrical component. In this way, the presence detectable baffle (102) can be inserted into a slot configured to receive the electrical component that the presence detectable baffle (102) is designed to mimic in shape and the pin set of the baffle (102) may physically connect to a pin receptacle of the slot in the same manner that a pin set of the electrical component connects to the pin receptacle of the slot. Consider an example in which the presence detectable baffle (102) is designed to mimic the form of a PCIe expansion card. In such an example, the presence detectable pin set (106) of the presence detectable baffle (102) is similar enough in physical form to the pin set of a PCIe expansion card so that the presence detectable baffle's (102) pin set (106) may be inserted into a pin set receptacle of a PCIe expansion slot— the same pin set receptacle that receives typical PCIe expansion cards. In the example of FIG. 3, the presence detectable pin set (106) is coupled to the apparatus (202) through a slot (204, 206, 208).

In the example of FIG. 3, the presence detectable pin (106) set may include a pin set compatible with the PCIe specification and the slots (204, 206, 208) for receiving an electrical component may be embodied as PCIe expansion slots. The PCIe specification defines the form factor that the pin set of a PCIe expansion card must take and further defines how each pin is utilized. The PCIe specification also defines the form factor that PCIe expansion slot must take. According to the PCIe specification, interconnects between a PCIe expansion card and a PCIe expansion slots are composed of lanes. Each lane is composed of a transmit pair and receive pair of differential lines. Physical PCIe expansion slots may contain anywhere from one to thirty-two lanes, with lane counts written with an "x" prefix (e.g., x4 represents a four-lane expansion card or expansion slot).

In the example of FIG. 3, the slots (204, 206, 208) for receiving an electrical component having a set of pins may be memory module slots. Memory module slots may be any slot capable of receiving a memory module and coupling the memory module to another component of the apparatus (202) such as, for example, a motherboard. Examples of memory modules that may be mounted in the slots (204, 206, 208) include a DIMM, a RIMM, a SIMM, and so on.

The apparatus (202) may include many other components not illustrated in FIG. 3. The apparatus (202) may be embodied, for example, as a blade server, a general purpose computer, a stand-alone server, and so on. The apparatus (202) may therefore include computer processors, computer memory, communications adapters, data communications busses, printed circuit boards, and other components as will occur to those of skill in the art.

Figure 4:
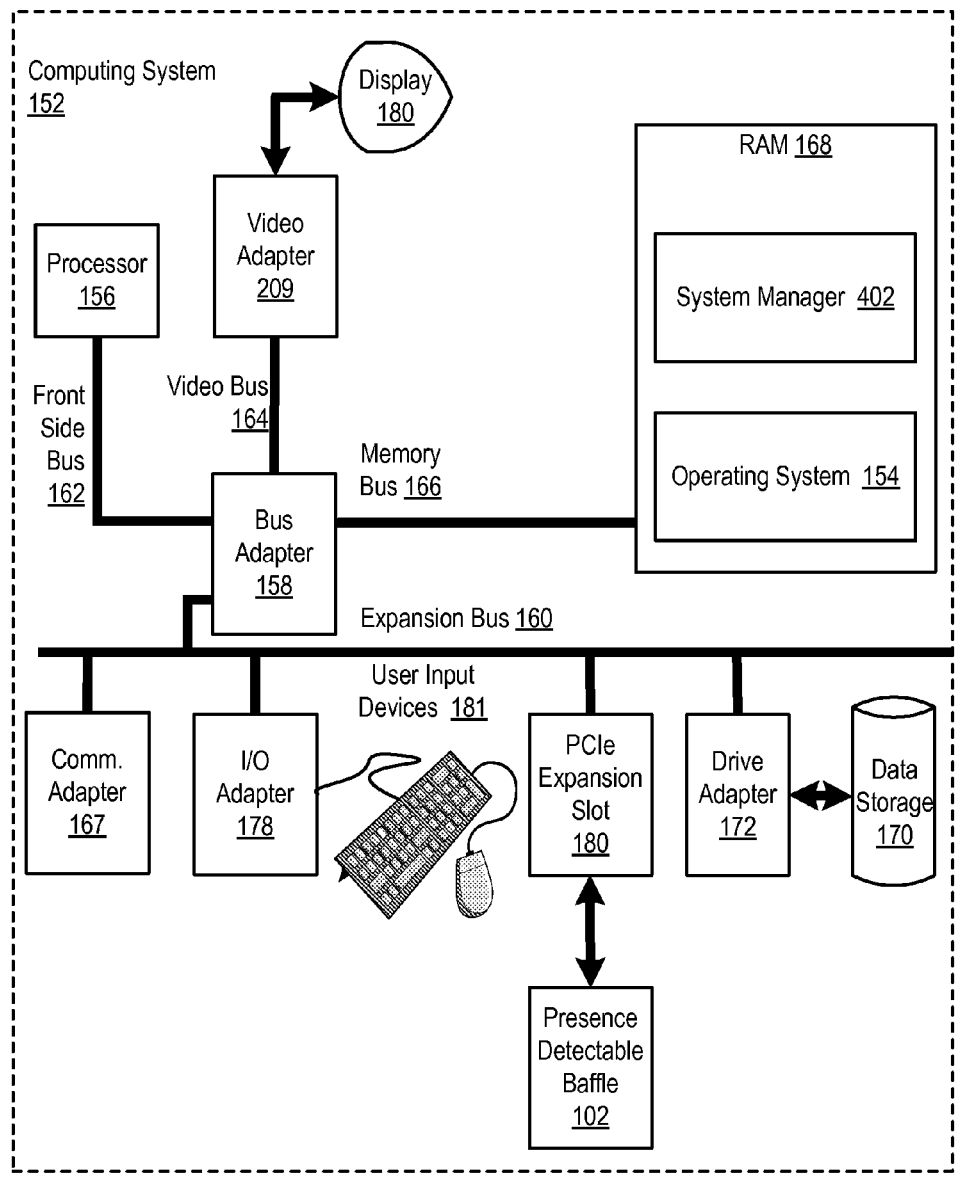
FIG. 4 sets forth a flow chart illustrating an example method of administering computing system resources according to embodiments of the present invention.

FIG. 4 sets forth a block diagram of automated computing machinery comprising an exemplary computing system (152) useful in administering computing system resources, according to embodiments of the present invention. The computing system (152) of FIG. 4 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is a system manager (402), a module of computer program instructions to monitor various aspects of the computing system (152) and allocate resources within the computing system (152). The system manager (402) may be configured to, for example, monitor temperature within the computing system (152), monitor memory usage within the computing system (152), monitor processor usage within the computing system (152), detect error conditions within the computing system (152), and so on.

In the example of FIG. 4, the computing system (152) administers computing system resources by identifying, by the system manager (402), a presence detectable baffle (102). The system manager (402) can identify the presence detectable baffle (102), for example, by performing (406) one or more presence detection operations. In the example of FIG. 4, a presence detection operation is an operation initiated by the system manager (402) to determine whether a computing component is inserted in a particular slot, such as PCIe expansion slot (180). The presence detection operation may also be configured to determine the nature of the computing component inserted in the particular slot. For example, the system manager (402) may initiate a presence detection operation to determine whether a computing component is inserted in PCIe expansion slot (180). In response to the presence detection operation, the system manager (402) may receive a presence detection value associated with the presence detectable baffle (102), thereby indicating that the presence detectable baffle (102) is inserted in the PCIe expansion slot (180).

In the example of FIG. 4, the computing system (152) further administers computing system resources by managing, by the system manager (402), computing system operating attributes in dependence upon presence detectable baffle (102) attributes. In the example of FIG. 4, computing system (152) operating attributes describe the current operating state of the computing system (152). The computing system (152) operating attributes may define, for example, how much power to allocate to a particular resource, whether a particular resource is available for use by other computing components, and so on. In the example method of FIG. 4, presence detectable baffle attributes may include attributes that describe the type of device whose form the presence detectable baffle (102) is designed to mimic. For example, the presence detectable baffle attributes may indicate that the presence detectable baffle (102) is designed to mimic the form of a PCIe expansion card.

In the example of FIG. 4, the system manager (402) may manage computing system operating attributes in dependence upon presence detectable baffle (102) attributes, for example, by altering power allocation in the computing system (152). Consider an example in which the presence detectable baffle (102) attributes indicate that a passive presence detectable baffle (102) is inserted in the PCIe expansion slot (180). In such an example, the system manager (402) may alter power allocation in the computing system (152) by not providing power to the PCIe expansion slot (180) that includes the passive presence detectable baffle (102) because the passive presence detectable baffle (102) is not an active component that requires power.

Also stored in RAM (168) is an operating system (154). Operating systems useful administering computing system resources according to embodiments of the present invention include UNIX™, Linux™, Microsoft XP™, AIX™, IBM's i5/OS™, and others as will occur to those of skill in the art. The operating system (154) and system manager (402) in the example of FIG. 4 are shown in RAM (168), but many components of such software typically are stored in non-volatile memory also, such as, for example, on a disk drive (170).

The computing system (152) of FIG. 4 includes disk drive adapter (172) coupled through expansion bus (160) and bus adapter (158) to processor (156) and other components of the computing system (152). Disk drive adapter (172) connects non-volatile data storage to the computing system (152) in the form of disk drive (170). Disk drive adapters useful in computers for administering computing system resources according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 4 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 4 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 4 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for administering computing system resources according to embodiments of the present invention include modems for wired dial-up communications, Ethernet (IEEE 802.3) adapters for wired data communications network communications, and 802.11 adapters for wireless data communications network communications.

Figure 5:
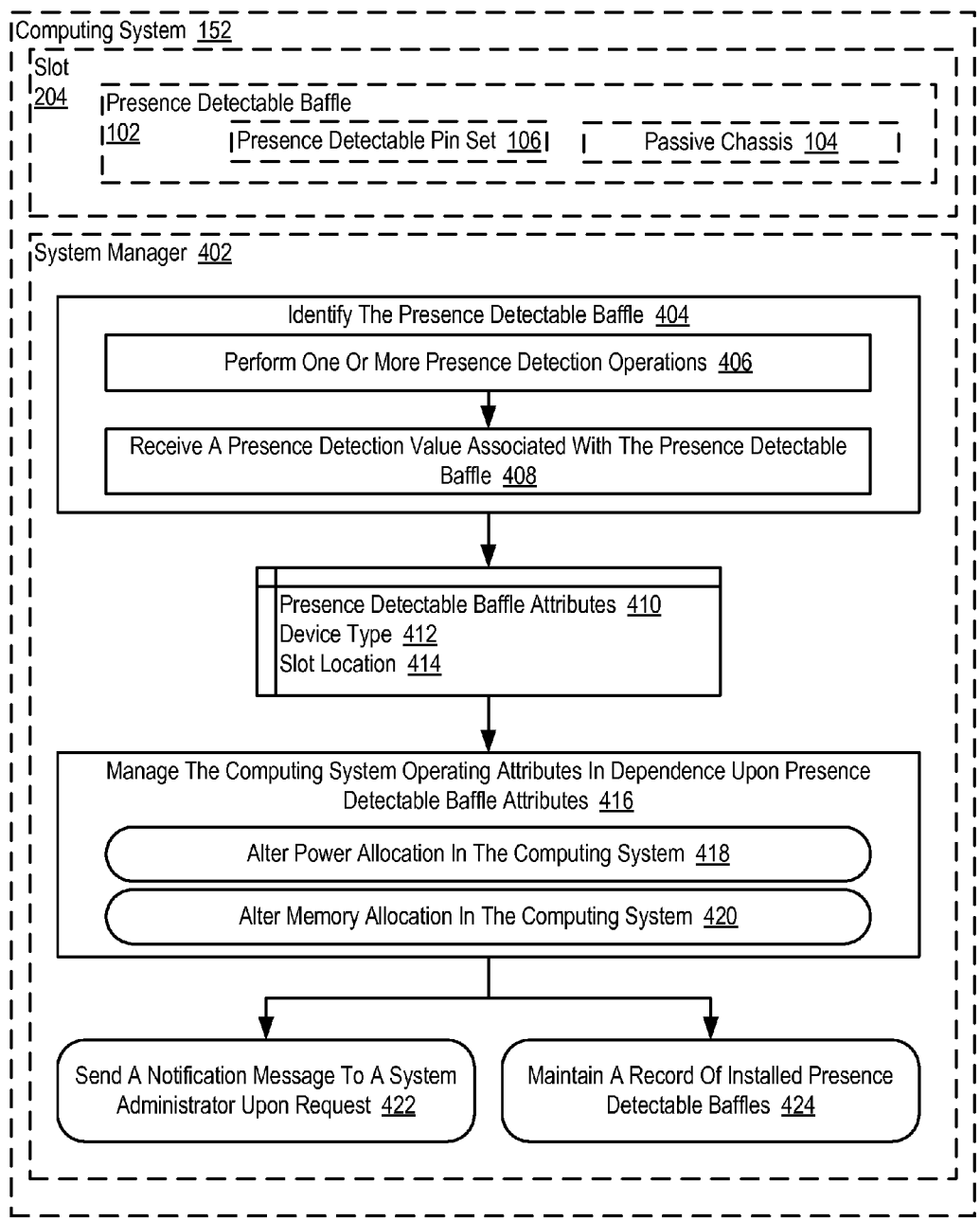
FIG. 5 sets forth a flow chart illustrating an example method of administering computing system resources according to embodiments of the present invention.

For further explanation, FIG. 5 sets forth a flow chart illustrating an example method of administering computing system resources within a computing system (152) according to embodiments of the present invention. The computing system (152) of FIG. 5 includes at least one slot (204) adapted to receive an electrical component having a set of pins. The slot (204) of FIG. 5 is configured to couple pins of the electrical component to the computing system (152). The slot (204) of FIG. 5 may include a plurality of pins that are wired into a circuit board or other component of the computing system (152) that the slot (204) is mounted on. In the example method of FIG. 5, the slot (204) is capable of receiving an electrical component such as, for example, an expansion card, a memory module, and so on. The slot (204) is physically configured such that once an electrical component is inserted into the slot (204), an electrical connection is established between the electrical component and the computing system (152). The slot (204) can adhere to a defined standard such as, for example, PCIe, PCI, and so on.

In the example method of FIG. 5, a presence detectable baffle (102) is installed within the slot (204). In the example of FIG. 5, the presence detectable baffle (102) includes a passive chassis (104) having a form factor consistent with the electrical component. A presence detectable baffle (102) that is designed to replicate the presence of a PCIe expansion card, for example, may include a passive chassis (104) having a form factor that is consistent with a PCIe expansion card. The passive chassis (104) of such an example presence detectable baffle (102) is similar in volume and shape to that of an actual PCIe expansion card. A passive chassis (104) of a presence detectable baffle (102) may be implemented with a variety of materials including, as one example, molded plastic.

The presence detectable baffle (102) also includes a presence detectable pin set (106) connected to the passive chassis (104). In the example of FIG. 5, the presence detectable pin set (106) is consistent with the electrical component that the presence detectable baffle (102) is designed to mimic in shape. The presence detectable pin set (106) is consistent with the electrical component in the sense that the presence detectable pin set (106) may have the same physical form as the pin set of the electrical component. In this way, the presence detectable baffle (102) can be inserted into a slot configured to receive the electrical component that the presence detectable baffle (102) is designed to mimic in shape and the pin set of the baffle (102) may physically connect to a pin receptacle of the slot in the same manner that a pin set of the electrical component connects to the pin receptacle of the slot. Consider an example in which the presence detectable baffle (102) is designed to mimic the form of a PCIe expansion card. In such an example, the presence detectable pin set (106) of the presence detectable baffle (102) is similar enough in physical form to the pin set of a PCIe expansion card so that the presence detectable baffle's (102) pin set (106) may be inserted into a pin set receptacle of a PCIe expansion slot—the same pin set receptacle that receives typical PCIe expansion cards. In the example of FIG. 5, the presence detectable pin set (106) is coupled to the apparatus (202) through a slot (204, 206, 208).

The example method of FIG. 5 includes identifying (404), by a system manager (402), the presence detectable baffle (102). In the example method of FIG. 5, the system manager (402) may be embodied as a module of computer program instructions that, when executed, monitor various aspects of the computing system (152) and allocates resources within the computing system (152). The system manager (402) may be configured to, for example, monitor temperature within the computing system (152), monitor memory usage within the computing system (152), monitor processor usage within the computing system (152), detect error conditions within the computing system (152), and so on.

In the example method of FIG. 5, identifying (404) the presence detectable baffle (102) can include performing (406) one or more presence detection operations. In the example method of FIG. 5, a presence detection operation is an operation initiated by the system manager (402) to determine whether a computing component is inserted in a particular slot (204). The presence detection operation may also be configured to return a device type value that is used to determine the nature of the computing component inserted in the particular slot (204). The presence detection operations may be embodied, for example, as a module of computer program instructions that read voltage values of predetermined pins of the slot (204).

In the example method of FIG. 5, identifying (404) the presence detectable baffle (102) can also include receiving (408) a presence detection value associated with the presence detectable baffle (102). In the example of FIG. 5, the presence detection value associated with the presence detectable baffle (102) may be embodied, for example, as voltage levels across particular pins of the slot (402), as a binary value derived from reading voltage levels from multiple pins of the slot (402), and so on. The presence detection value may be used to identify the device that is inserted in the slot (402), for example, by looking up the presence detection value in a table that associates particular devices with particular values.

The example method of FIG. 5 also includes managing (416), by the system manager (402), computing system (152) operating attributes in dependence upon presence detectable baffle attributes (410). In the example of FIG. 5, computing system (152) operating attributes describe the current operating state of the computing system (152). The computing system (152) operating attributes may define, for example, how much power to allocate to a particular resource, whether a particular resource is available for use by other computing components, and so on. In the example method of FIG. 5, presence detectable baffle attributes (410) may include attributes that describe the type of device that is normally installed in the slot (204) that contains the presence detectable baffle (102). For example, the presence detectable baffle attributes (410) may identify a device type (412) for the presence detectable baffle (102). The device type (412) may indicate that the presence detectable baffle (102) is, for example, a dummy PCIe expansion card, a dummy DIMM, a dummy PCI expansion card, and so on. The presence detectable baffle attributes (410) may further identify a slot location (414) for the presence detectable baffle (102). As such, the system manger (402) may determine the type of device that is installed in the slot (204) by looking up the slot location (414) in a lookup table that associates a particular slot (204) with the types of devices that can be inserted into the slot (204). For example, the system manger (402) may determine that the slot (204) is a PCIe slot, a PCI slot, a slot for housing a DIMM, and so on.

In the example method of FIG. 5, managing (416) computing system operating attributes in dependence upon presence detectable baffle attributes (410) can include altering (418) power allocation in the computing system (152). Consider an example in which the presence detectable baffle attributes (410) indicate that a passive presence detectable baffle (102) is inserted in a slot for a PCIe expansion card. In such an example, the system manager (402) may alter (418) power allocation in the computing system (152) by not providing power to the slot that includes the passive presence detectable baffle (102), because the passive presence detectable baffle (102) is not an active component that requires power, such as an active PCIe expansion card that would otherwise be installed in the slot.

In the example method of FIG. 5, managing (416) computing system (152) operating attributes in dependence upon presence detectable baffle attributes (410) can also include altering (420) memory allocation in the computing system (152). Consider an example in which the presence detectable baffle attributes (410) indicate that a passive presence detectable baffle (102) is inserted into a slot configured to receive a DIMM. In such an example, the system manager (402) may alter (420) memory allocation in the computing system (152) by removing devices installed in the slot that includes the passive presence detectable baffle (102) from a pool of memory that is available to applications executing on the computing system (152) because the passive presence detectable baffle (102) is not a computer memory device, such as a DIMM that would otherwise be installed in the slot.

The example method of FIG. 5 also includes sending (422), by the system manager (420), a notification message to a system administrator upon request. The system administrator may periodically request a notification messages to maintain an understanding of the current state of the computing system (152). In the example of FIG. 5, the notification message can include, for example, information indicating that a presence detectable baffle (102) is installed in the computing system (152), information identifying the particular slot that the presence detectable baffle (102) is installed in, information identifying the type of computing device that is normally installed in the particular slot that the presence detectable baffle (102) is installed in, and so on. The notification message may also indicate, for example, that a slot is completely empty and therefore a threat of elevated thermal conditions is present given that air flow may be altered.

The example method of FIG. 5 also includes maintaining (424) a record of installed presence detectable baffles. In the example method of FIG. 5, maintaining (424) a record of installed presence detectable baffles can include storing, for each installed presence detectable baffle, a slot identifier of the slot in which the presence detectable baffle is installed. Storing, for each installed presence detectable baffle, a slot identifier of the slot in which the presence detectable baffle is installed may be carried out, for example, by creating a table or other data structure that associates a slot identifier with a presence detectable baffle that is installed in the slot identified by the slot identifier.

Figure 6:
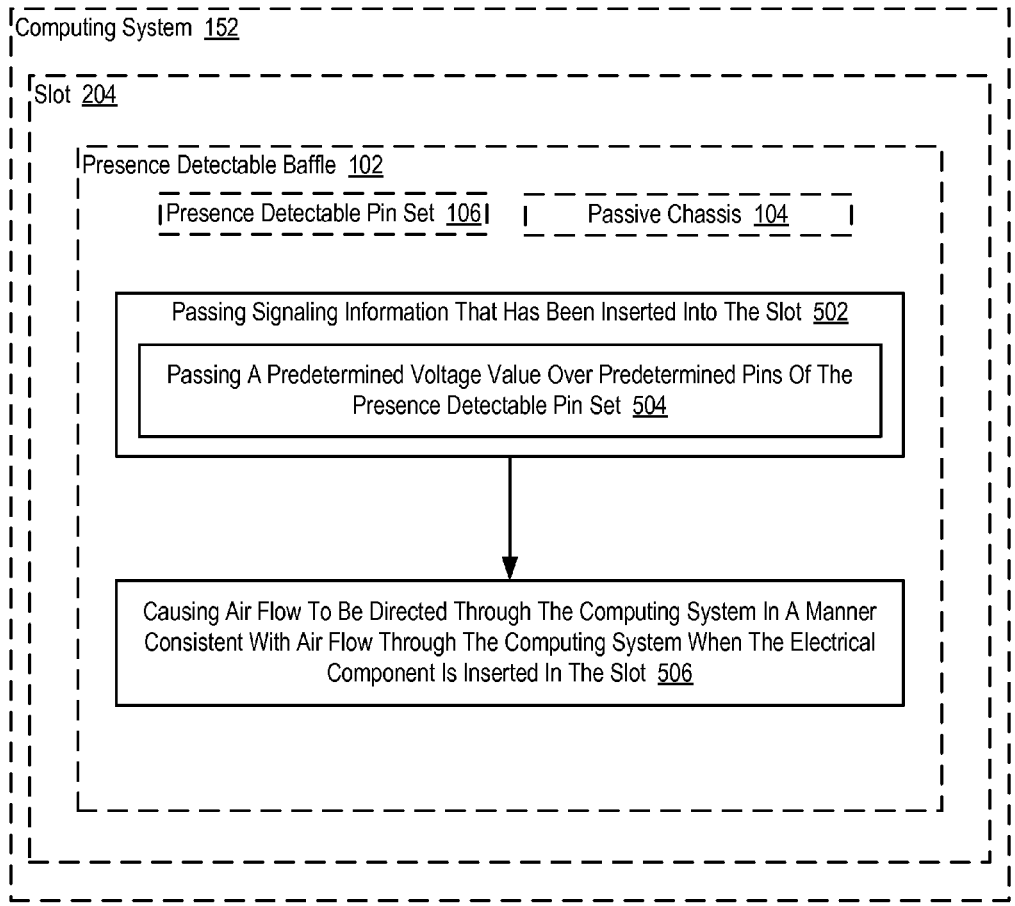
FIG. 6 sets forth a flow chart illustrating an example method of directing air flow in a computing system according to embodiments of the present invention.

For further explanation, FIG. 6 sets forth a flow chart illustrating an example method of directing air flow in a computing system (152) according to embodiments of the present invention. The computing system (152) of FIG. 6 includes a slot (204) for receiving an electrical component having a set of pins. The slot (204) of FIG. 6 can include a plurality of pins that may be wired into a circuit board that the slot (204) is mounted on. The slot (204) of FIG. 6 may be capable of receiving an electrical component such as, for example, an expansion card. The slot (204) is physically configured such that once an electrical component is inserted into the slot (204), an electrical connection is established between the electrical component and circuit board that the slot (204) is mounted on via the pins in the slot (204). In the example of FIG. 6, the slot (204) can adhere to a defined standard such as, for example, PCIe, PCI, and so on.

The example method of FIG. 6 includes passing (502) signaling information through a presence detectable baffle (102) that has been inserted into the slot (204). In the example of FIG. 6, the presence detectable baffle (102) includes a passive chassis (104) having a form factor consistent with an electrical component such as, for example, a PCIe expansion card, a DIMM, and so on. A presence detectable baffle (102) that is designed to replicate the presence of a PCIe expansion card, for example, may include a passive chassis (104) having a form factor that is consistent with a PCIe expansion card. The passive chassis (104) of such an example presence detectable baffle (102) is similar in volume and shape to that of an actual PCIe expansion card. A passive chassis (104) of a presence detectable baffle (102) may be implemented with a variety of materials including, as one example, molded plastic.

The presence detectable baffle (102) of FIG. 6 also includes a presence detectable pin set (106) connected to the passive chassis (104). In the example of FIG. 6, the presence detectable pin set (106) is consistent with the electrical component that the presence detectable baffle (102) is designed to mimic in shape. The presence detectable pin set (106) is consistent with the electrical component in the sense that the presence detectable pin set (106) may have the same physical form as the pin set of the electrical component. In this way, the presence detectable baffle (102) can be inserted into a slot configured to receive the electrical component that the presence detectable baffle (102) is designed to mimic in shape and the pin set of the baffle (102) may physically connect to a pin receptacle of the slot in the same manner that a pin set of the electrical component connects to the pin receptacle of the slot. Consider an example in which the presence detectable baffle (102) is designed to mimic the form of a PCIe expansion card. In such an example, the presence detectable pin set (106) of the presence detectable baffle (102) is similar enough in physical form to the pin set of a PCIe expansion card so that the presence detectable baffle's (102) pin set (106) may be inserted into a pin set receptacle of a PCIe expansion slot— the same pin set receptacle that receives typical PCIe expansion cards. In the example of FIG. 6, the presence detectable pin set (106) is coupled to the apparatus (202) through a slot (204).

In the example of FIG. 6, passing (502) signaling information through a presence detectable baffle (102) that has been inserted into the slot (204) may be carried out, for example, by passing (504) a predetermined voltage value over predetermined pins of the presence detectable pin set (106). For example, a low voltage may be placed on the two PRSNT2# signal lines as described above with reference to FIG. 2 to differentiate the presence detectable baffle (102) from an empty slot or an active expansion card.

The example method of FIG. 6 also includes causing (506), by the presence detectable baffle (102), air flow to be directed through the computing system (152). In the example of FIG. 6, the presence detectable baffle (102) causes (506) air flow to be directed through the computing system (152) in a manner that is consistent with air flow through the computing system (152) when the electrical component is inserted in the slot (204). Consider an example in which the presence detectable baffle (102) is designed to mimic the form of a PCIe expansion card. In such an example, because the physical form of the presence detectable baffle (102) is similar to the form of a PCIe expansion card, air flows through the computing system (152) in a similar manner as it would if an actual PCIe expansion card were inserted in the slot (204). Insertion of the presence detectable baffle (102) into a slot (204) that would otherwise be occupied by a fully functional computing component can therefore cause air to flow through the computing system (152) as if a fully functional computing component was inserted in the slot (204).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of directing air flow in a computing system, the computing system including a slot for receiving an electrical component having a set of pins, the method comprising:

passing signaling information through a presence detectable baffle that has been inserted into the slot, wherein the presence detectable baffle includes a passive chassis having a form factor consistent with an electrical component and a presence detectable pin set that is consistent with the electrical component; and causing, by the presence detectable baffle, air flow to be directed through the computing system in a manner consistent with air flow through the computing system when the electrical component is inserted in the slot wherein:

the presence detectable pin set is configured to indicate to a system manager that the presence detectable baffle is installed and that the presence detectable baffle is passive; and the system manager is configured to identify, the presence detectable baffle after installation of the presence detectable and manage computing system operating attributes in dependence upon presence detectable baffle attributes.

2. The method of claim 1 wherein the presence detectable baffle includes a pin set compatible with the peripheral component interconnect express ('PCIe') specification.

3. The method of claim 1 wherein the slot is a peripheral component interconnect express ('PCIe') expansion slot.

4. The method of claim 1 wherein the electrical component of the computing system is an expansion card.

5. The method of claim 1 wherein the electrical component of the computing system is a memory module.

6. The method of claim 1 wherein passing signaling information through the presence detectable baffle includes passing a predetermined voltage value over predetermined pins of the presence detectable pin set.

* * * * *